United States Patent [19]
Sato et al.

[11] Patent Number: 5,856,058
[45] Date of Patent: *Jan. 5, 1999

[54] CHEMICAL-SENSITIZATION POSITIVE-WORKING PHOTORESIST COMPOSITION

[75] Inventors: Kazufumi Sato, Sagamihara; Kazuyuki Nitta, Kanagawa-ken; Akiyoshi Yamazaki, Yokohama; Yoshika Sakai, Atsugi; Toshimasa Nakayama, Chigasaki, all of Japan

[73] Assignee: Tokyo Ohka Kogyo Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 660,378

[22] Filed: Jun. 7, 1996

[30] Foreign Application Priority Data

Jun. 15, 1995 [JP] Japan .................................. 7-149286

[51] Int. Cl.$^6$ ..................................... G03F 7/023
[52] U.S. Cl. ........................... 430/191; 430/192; 430/193
[58] Field of Search ..................... 430/191, 192, 430/193

[56] References Cited

U.S. PATENT DOCUMENTS 5,403,695  4/1995  Hayase et al. ........................ 430/191
5,525,453  6/1996  Przybilla et al. ..................... 430/191

FOREIGN PATENT DOCUMENTS 6-317902  11/1994  Japan .

Primary Examiner—Christopher G. Young
Attorney, Agent, or Firm—Wenderoth, Lind & Ponack, L.L.P.

[57] ABSTRACT

Proposed is a novel chemical sensitization-type positive-working photoresist composition used for the photolithographic patterning works in the manufacture of semiconductor devices exhibiting an excellent halation-preventing effect in the patternwise exposure to light. The composition comprises, in addition to conventional ingredients including an acid-generating agent capable of releasing an acid by the irradiation with actinic rays and a resinous ingredient capable of being imparted with increased solubility in an aqueous alkaline developer solution in the presence of an acid, a unique halation inhibitor which is an esterification product between a specified phenolic compound and a naphthoquinone-1,2-diazide sulfonic acid.

48 Claims, No Drawings

CHEMICAL-SENSITIZATION POSITIVE-WORKING PHOTORESIST COMPOSITION

BACKGROUND OF THE INVENTION

The present invention relates to a novel positive-working photoresist composition of the chemical sensitization type or, more particularly, to a positive-working photoresist composition of the chemical sensitization type capable of giving a patterned resist layer with high sensitivity and high resolution which is free from the adverse influences of halation and standing waves on the cross sectional profile of the patterned resist layer and has excellent stability of the resist layer before development.

It is a recent trend in the electronic technology to have a requirement for a higher and higher degree of integration of semiconductor devices. This requirement of course cannot be satisfied without improvements in the resolution in the patterning of the resist layer.

In place of the conventional alkali-developable positive-working photoresist compositions comprising, as the basic ingredients, a novolac resin as a film-forming agent and a quinonediazide group-containing compound as a photosensitizing agent, so-called chemical sensitization-type photoresist compositions have been recently developed as a class of promising photoresist materials and are now under way of replacing the conventional photoresist compositions in respect of several advantages. For example, the patternwise exposure of the photoresist composition of this type can be performed by using an ultraviolet light of a shorter wavelength of 200 to 300 nm, such as deep ultraviolet light and excimer laser beams, than for the conventional alkali-developable photoresist compositions while a shorter wavelength of the actinic rays for patternwise exposure is an advantageous condition for the improvement of the resolution in patterning. In addition, the photosensitivity of a chemical sensitization-type photoresist composition can be high by virtue of the nature of the catalytic reaction, which is a kind of a chain reaction, caused by the acid generated by the irradiation of the acid-generating agent with actinic rays for the latent image formation.

While, in the initial stage of development, an alkali-soluble novolac resin, which is the resinous ingredient in the conventional alkali-developable positive-working photoresist compositions, was used also in the chemical sensitization resist compositions as the resinous ingredient, such a novolac resin is not satisfactory therein because the transmissivity of the short-wavelength ultraviolet light through the resist layer containing the novolac resin is so low that the resist layer cannot be exposed patternwise to the ultraviolet light to the bottom of the layer in contact with the substrate surface not to accomplish high-fidelity patterning and not to give an orthogonal cross sectional profile of the patterned resist layer which in this case is rather trapezoidal along with a decrease in the sensitivity and resolution. Accordingly, it is proposed to use, in place of a novolac resin, a poly (hydroxystyrene) resin modified by substituting for at least a part of the hydroxy groups with protective groups having acid-induced dissociability utilizing the higher ultraviolet transmissivity than novolac resins so as to improve the characteristics of the photoresist composition relative to the ultraviolet transmissivity.

As is sometimes the case, positive-working photoresist compositions are used on a substrate having a coating film of a metallic or inorganic substance such as aluminum, aluminum-silicon-copper alloys, titanium nitride, tungsten and the like and the patternwise exposure of the photoresist layer to ultraviolet light may be subject to the troubles of decreased precision and fidelity in fine patterning due to irregular reflection of the light at the surface of the coating layer and occurrence of standing waves so that the reflected light reaches the photosensitive layer behind the pattern on the photomask resulting in localized narrowing of a line pattern or wavy side lines of a pattern.

With an object to solve the above described problems, proposals are made in Japanese Patent Kokai 58-174941, 60-88941, 63-136040, 63-159843 and elsewhere to formulate a positive-working photoresist composition comprising a novolac resin and a quinonediazide group-containing compound with various kinds of halation inhibiting agents when the photoresist composition is to be used on a substrate surface of high reflectivity. Despite the fact that the above mentioned troubles are more serious in the chemical sensitization-type photoresist compositions having higher light transmissivity than the conventional photoresist compositions, no proposals have been made heretofore for a halation inhibiting agent having effectiveness even in a chemical sensitization-type photoresist composition.

SUMMARY OF THE INVENTION

The present invention accordingly has an object to provide a novel and improved chemical sensitization-type positive-working photoresist composition capable of effectively preventing the adverse influences due to the phenomena of halation and occurrence of standing waves when the resist composition is used to form a resist layer on a substrate surface of high reflectivity such as a metallic surface.

Thus, the chemical sensitization-type positive-working photoresist composition of the invention is a uniform blend which comprises:

(a) a compound capable of generating an acid by the irradiation with actinic rays;

(b) a polymeric resin which is imparted with increased solubility in an aqueous alkaline solution in the presence of an acid; and (c) an esterification product between a phenolic compound having a molecular weight not exceeding 1000 and a naphthoquinone-1,2-diazide sulfonic acid, which serves as a halation inhibitor, in an amount in the range from 0.5 to 20% by weight based on the amount of the component (b).

In particular, the phenolic compound, from which the component (c) is prepared by the esterification reaction with a naphthoquinonediazide sulfonic acid, is a compound represented by the general formula

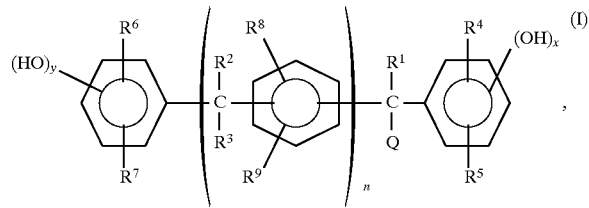

in which $R^1$, $R^2$ and $R^3$ are each a hydrogen atom or an alkyl group having 1 to 4 carbon atoms, $R^4$ to $R^7$ are each a group or atom selected from the group consisting of a hydrogen atom, halogen atoms, alkyl groups having 1 to 4 carbon atoms, alkoxy groups having 1 to 4 carbon atoms, alkenyl groups having 2 to 4 carbon atoms and cyclohexyl group, $R^8$ and $R^9$ are each a hydrogen atom, halogen atom or alkyl group having 1 to 4 carbon atoms, Q is a hydrogen atom, alkyl group having 1 to 4 carbon atoms or a phenolic group represented by the general formula

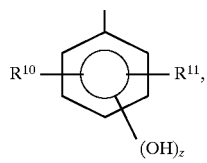
(II)

$R^{10}$ and $R^{11}$ each being a group or atom selected from the group consisting of a hydrogen atom, halogen atoms, alkyl groups having 1 to 4 carbon atoms, alkoxy groups having 1 to 4 carbon atoms, alkenyl groups having 2 to 4 carbon atoms and cyclohexyl group and the subscript z being 1, 2 or 3, the subscripts x and y are each 1, 2 or 3 and the subscript n is 0 or 1, or, preferably, a compound represented by the general formula

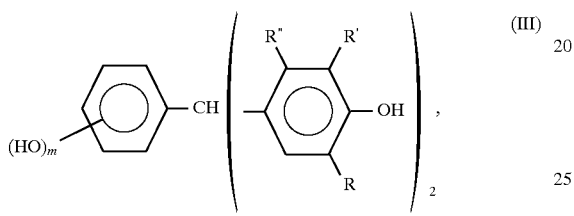
(III)

in which R is a methyl or cyclohexyl group, R' and R" are each a hydrogen atom or methyl group and the subscript m is 1 or 2, as well as 1-[1-(4-hydroxyphenyl)isopropyl]-4-[1, 1-bis(4-hydroxyphenyl)ethyl] benzene.

DETAILED DESCRIPTION OF THE PREFERRED EMBODIMENTS

As is described above, the inventive photoresist composition comprises, as the essential ingredients, the components (a), (b) and (c), of which the most characteristic is the component (c) as a halation inhibitor, the components (a) and (b) being rather conventional. This compound is an esterification product between a phenolic compound having a molecular weight not exceeding 1000 and a naphthoquinone-1,2-diazide sulfonic acid or, preferably, naphthoquinone-1,2-diazide-5-sulfonic acid which has been unexpectedly discovered as a result of the extensive investigations undertaken by the inventors.

Japanese Patent Kokai 6-317902 discloses that, among the esters of a naphthoquinone-1,2-diazide sulfonic acid, esters of naphthoquinone-1,2-diazide-4-sulfonic acid serve as an acid generator by the irradiation with actinic rays in a chemical sensitization-type photoresist composition. However, the acid-generating efficiency thereof is rather low so that the sensitivity of the photoresist composition cannot be high enough unless the compounding amount thereof in a photoresist composition is increased so much that an undue decrease is caused in the light transmissivity of the composition per se along with degradation of the pattern resolution.

Examples of the compounds suitable as the component (a) include:

i) bis(sulfonyl) diazomethane compounds such as bis(p-toluenesulfonyl) diazomethane, methylsulfonyl p-toluenesulfonyl diazomethane, cyclohexylsulfonyl 1,1-dimethylethylsulfonyl diazomethane, bis(1,1-dimethylethylsulfonyl) diazomethane, bis(1-methylethylsulfonyl) diazomethane, bis (cyclohexylsulfonyl) diazomethane, bis(2,4-dimethylphenylsulfonyl) diazomethane, bis(4-ethylphenylsulfonyl) diazomethane, bis(3-methylphenylsulfonyl) diazomethane, bis(4-methoxyphenylsulfonyl) diazomethane, bis(4-fluorophenylsulfonyl) diazomethane, bis(4-chlorophenylsulfonyl) diazomethane, bis(4-tert-butylphenylsulfonyl) diazomethane and the like;

ii) sulfonyl carbonyl alkane compounds such as 2-methyl-2-(p-toluenesulfonyl) propiophenone, 2-cyclohexylcarbonyl-2-(p-toluenesulfonyl) propane, p-methylthiophenyl (1-methane-sulfonyl-1-methyl)ethyl ketone, 2,4-dimethyl-2-(p-toluene-sulfonyl)pentan-3-one and the like;

iii) sulfonyl carbonyl diazomethane compounds such as p-toluenesulfonyl cyclohexylcarbonyl diazomethane, 1-diazo-1-methylsulfonyl-4-phenyl-2-butanone, cyclohexylcarbonyl cyclohexylsulfonyl diazomethane, 1-cyclohexylsulfonyl-1-diazo-3,3-dimethyl-2-butanone, 1-diazo-1-(1,1-dimethylethylsulfonyl)-3,3-dimethyl-2-butanone, 1-acetyl-1-(1-methylethylsulfonyl) diazomethane, 1-diazo-1-(p-toluenesulfonyl)-3,3-dimethyl-2-butanone, 1-benzenesulfonyl-1-diazo-3,3-dimethyl-2-butanone, 1-diazo-1-(p-toluenesulfonyl)-3-methyl-2-butanone, 2-diazo-2-(p-toluenesulfonyl)cyclohexyl acetate, 2-benzenesulfonyl-2-diazo tert-butyl acetate, 2-diazo-2-methanesulfonyl isopropyl acetate, 2-benzenesulfonyl-2-diazo cyclohexyl acetate, 2-diazo-2-(p-toluenesulfonyl) tert-butyl acetate and the like;

iv) nitrobenzyl sulfonate compounds such as 2-nitrobenzyl p-toluenesulfonate, 2,6-dinitrobenzyl p-toluenesulfonate, 2,4-dinitrobenzyl p-trifluoromethylbenzene sulfonate and the like; and v) esters of a polyhydroxy compound and an aliphatic or aromatic, e.g., phenyl and benzyl, sulfonic acid such as pyrogallol methanesulfonates, pyrogallol benzenesulfonates, pyrogallol p-toluenenesulfonates, pyrogallol p-methoxybenzenesulfonates, pyrogallol mesitylenesulfonates, pyrogallol benzylsulfonates, esters of an alkyl gallate and methane sulfonic acid, esters of an alkyl gallate and benzene sulfonic acid, esters of an alkyl gallate and p-toluenesufonic acid, esters of an alkyl gallate and p-methoxybenzenesulfonic acid, esters of an alkyl gallate and mesitylenesulfonic acid, esters of an alkyl gallate and benzylsulfonic acid and the like. The alkyl group in the alkyl gallate preferably has 1 to 15 carbon atoms and octyl and lauryl groups are more preferable.

Besides the above named five classes i) to v), onium salts such as bis(p-tert-butylphenyl) iodonium trifluoromethane sulfonate, triphenyl sulfonium trifluoromethane sulfonate and the like can also be used as the component (a). Among the above named compounds, bissulfonyl diazomethanes are preferable and, in particular, bis(cyclohexylsulfonyl) diazomethane and bis(2,4-dimethylphenylsulfonyl) diazomethane are more preferable. These compounds can be used either singly or as a combination of two kinds or more according to need.

The component (b), which serves as a film-forming agent and is imparted with increased solubility in an aqueous alkaline solution in the presence of an acid, can be any of those conventionally used in chemical sensitization-type photoresist compositions including poly(hydroxystyrene) resins substituted by suitable protective groups for at least a part of the hydrogen atoms in the hydroxy groups. Examples of the above mentioned protective groups include tert-butoxycarbonyl, tert-butyl and tert-amyloxycarbonyl groups as well as acetal groups such as alkoxyalkyl, tetrahydropyranyl and tetrahydrofuranyl groups. A poly(hydroxystyrene)

resin substituted by these protective groups for a part of the hydrogen atoms of the hydroxy groups can be prepared by the copolymerization reaction of a hydroxystyrene monomer and a substituted hydroxystyrene monomer or obtained by the polymer reaction by which protective groups are introduced into a poly(hydroxystyrene) resin. Various partially substituted poly(hydroxystyrene) resins are known in the prior art including copolymers of tert-butoxycarbonyloxy styrene and p-hydroxystyrene disclosed in Japanese Patent Kokai 2-209977, copolymers of p-tetrahydropyranyloxy styrene and p-hydroxystyrene disclosed in Japanese Patent Kokai 2-19847, copolymers of tert-butoxy styrene and p-hydroxystyrene disclosed in Japanese Patent Kokai 2-62544, poly(hydroxystyrene) resins having hydroxy groups protected by acetal groups disclosed in Japanese Patent Kokai 3-282550, poly(hydroxystyrene) resins having hydroxy groups protected by alkoxyalkyl groups disclosed in Japanese Patent Kokai 5-249682 and so on. These poly (hydroxystyrene)-based resins can be used either singly or as a combination of two kinds or more according to need. It is preferable that the component (b) is a combination of a first poly(hydroxystyrene)-based resin, of which from 10 to 60% of the hydroxy groups are substituted by tert-butoxycarbonyl groups for the hydrogen atoms of the hydroxy groups, and a second poly(hydroxystyrene)-based resin, of which from 10 to 60% of the hydroxy groups are substituted by alkoxyalkyl groups for the hydrogen atoms of the hydroxy groups, in a weight proportion of 10:90 to 70:30 or, preferably, 20:80 to 50:50.

The alkoxyalkyl groups mentioned above, of which the alkyl and alkoxy groups each preferably have 1 to 4 carbon atoms, as the protective groups include 1-methoxyethyl, 1-ethoxyethyl, 1-n-propoxyethyl, 1-isopropoxyethyl, 1-n-butoxyethyl, 1-isobutoxyethyl, 1-(1,1-dimethylethoxy)-1-methylethyl, 1-methoxy-1-methylethyl, 1-ethoxy-1-methylethyl, 1-n-propoxy-1-methylethyl, 1-isobutoxy-1-methylethyl, 1-methoxy-n-propyl and 1-ethoxy-n-propyl groups, among which 1-ethoxyethyl and 1-methoxy-n-propyl groups are more preferable in respect of the good balance between sensitivity and pattern resolution.

When the inventive photoresist composition compounded with these resinous ingredients as the component (b) is irradiated with actinic rays, the acid released from the component (a) acts on these protective groups to cause dissociation thereof so as to accomplish a good balance between the solubility of the resinous ingredient and the dissolution-inhibiting effect of the tert-butoxycarbonyl groups and the like to impart the photoresist composition with high sensitivity, high resolution and high heat resistance. When the component (b) is a combination of the first and second poly(hydroxystyrene)-based resins described above, it is important that the blending proportion thereof is within the above mentioned range.

The first poly(hydroxystyrene)-based resin having the hydroxy groups substituted by tert-butoxycarbonyl groups for the hydrogen atoms can be prepared by the reaction of, for example, di-tert-butyl dicarbonate and the like with a poly(hydroxystyrene) resin. The degree of substitution is in the range from 10 to 60% or, preferably, from 20 to 50%. When the degree of substitution therein is too low, a decrease is caused in the orthogonality of the cross sectional profile of a patterned resist layer formed from the photoresist composition. When the degree of substitution therein is too high, on the other hand, a decrease is caused in the photosensitivity of the photoresist composition to actinic rays.

The second poly(hydroxystyrene)-based resin having the hydroxy groups substituted by alkoxyalkyl groups for the hydrogen atoms can be prepared by the reaction of, for example, 1-chloro-1-ethoxy ethane, 1-chloro-1-methoxy propane and the like with a poly(hydroxystyrene) resin. The degree of substitution is in the range from 10 to 60% or, preferably, from 20 to 50%. When the degree of substitution therein is too low, a decrease is caused in the orthogonality of the cross sectional profile of a patterned resist layer formed from the photoresist composition. When the degree of substitution therein is too high, on the other hand, a decrease is caused in the photosensitivity of the photoresist composition to actinic rays.

It is further desirable that the resinous ingredient as the component (b) has a weight-average molecular weight in the range from 3000 to 30000 as determined by the gel-permeation chromatographic method making reference to polystyrenes having known molecular weights. When the weight-average molecular weight of the component (b) is too low, the photoresist layer formed from the composition would have poor mechanical properties as a surface film while, when the weight-average molecular weight thereof is too high, a decrease is caused in the solubility of the resist layer in an aqueous alkaline solution in the development treatment.

The amount of the component (a) as the acid generating agent in the inventive photoresist composition is in the range from 1 to 20 parts by weight or, preferably, from 2 to 10 parts by weight per 100 parts by weight of the component (b). When the amount of the component (a) is too small, an undue decrease is caused in the photosensitivity of the composition due to the deficiency in the amount of an acid to be released from the component (a) by the irradiation with actinic rays while, when the amount thereof is too large, a decrease is caused in the alkali-solubility of the resist layer after patternwise exposure of the resist layer to actinic rays.

The component (c), which serves as a halation inhibitor in the inventive photoresist composition, is an esterification product of a phenolic compound having a molecular weight not exceeding 1000 and a naphthoquinone-1,2-diazide sulfonic acid compound. The above mentioned phenolic compound is a compound represented by the general formula

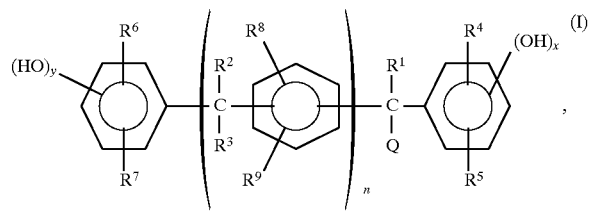

in which $R^1$, $R^2$ and $R^3$ are each a hydrogen atom or an alkyl group having 1 to 4 carbon atoms, $R^4$ to $R^7$ are each a group or atom selected from the group consisting of a hydrogen atom, halogen atoms, alkyl groups having 1 to 4 carbon atoms, alkoxy groups having 1 to 4 carbon atoms, alkenyl groups having 2 to 4 carbon atoms and cyclohexyl group, $R^8$ and $R^9$ are each a hydrogen atom, halogen atom or alkyl group having 1 to 4 carbon atoms, Q is a hydrogen atom, alkyl group having 1 to 4 carbon atoms or a phenolic group represented by the general formula

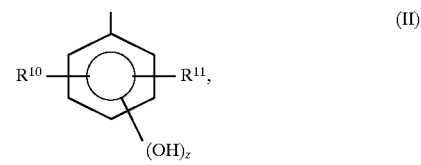

$R^{10}$ and $R^{11}$ each being a group or atom selected from the group consisting of a hydrogen atom, halogen atoms, alkyl groups having 1 to 4 carbon atoms, alkoxy groups having 1 to 4 carbon atoms, alkenyl groups having 2 to 4 carbon atoms and cyclohexyl group and the subscript z being 1, 2 or 3, the subscripts x and y are each 1, 2 or 3 and the subscript n is 0 or 1, or, preferably, a compound represented by the general formula

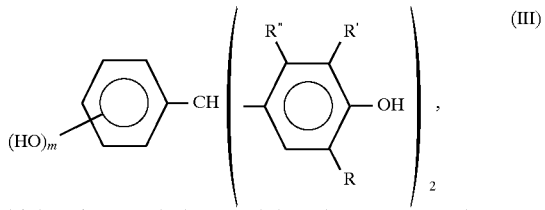

in which R is a methyl or cyclohexyl group, R' and R" are each a hydrogen atom or methyl group and the subscript m is 1 or 2, as well as 1-[1-(4-hydroxyphenyl)isopropyl]-4-[1, 1-bis(4-hydroxyphenyl)ethyl] benzene.

Particular examples of the phenolic compounds to meet the above described definitions include: bis(4-hydroxy-3,5-dimethylphenyl) 2-hydroxyphenyl methane, bis(4-hydroxy-3,5-dimethylphenyl) 3,4-dihydroxyphenyl methane, bis(4-hydroxy-3-methylphenyl) 3,4-dihydroxyphenyl methane, bis-(3-cyclohexyl-4-hydroxy-6-methylphenyl) 4-hydroxyphenyl methane, 2,2-bis(2,3,4-trihydroxyphenyl) propane, bis(2,3,4-trihydroxyphenyl) methane, tris(4-hydroxyphenyl) methane, bis(5-acetyl-2,3,4-trihydroxyphenyl) phenyl methane, bis(3,5-dimethyl-4-hydroxyphenyl) 4-hydroxy-3-methoxyphenyl methane, bis (2,5-dimethyl-4-hydroxyphenyl) 2-hydroxyphenyl methane, 1,1,1-tris(4-hydroxyphenyl) ethane, 1,4-bis[2-(2,4-dihydroxyphenyl)isopropyl] benzene, 1,4-bis[bis(3,5-dimethyl-4-hydroxyphenyl)methyl] benzene, 1,4-bis[bis(2, 5-dimethyl-4-hydroxyphenyl)methyl] benzene, 2,2-bis[4-hydroxy-3,5-bis(3,5-dimethyl-4-hydroxyphenylmethyl) phenyl] propane, 1,1,2,2-tetrakis(3,5-dimethyl-4-hydroxyphenyl) ethane, 1,3,3,5-tetrakis(4-hydroxyphenyl) pentane, 1,1,1,4,4,4-hexakis(4-hydroxyphenyl) butane, 1,3, 5-tris[1,1-bis(4-hydroxyphenyl)-ethyl] benzene, 1,3,5-tris [1,1-bis(3,5-dimethyl-4-hydroxy-phenyl)ethyl] benzene, 2,6-bis(2,4-dihydroxyphenyl methyl)-4-methyl phenol, 2,6-bis(2,3,4-trihydroxyphenyl methyl)-4-methyl phenol, 2,6-bis(2,4,6-trihydroxyphenyl methyl)-4-methyl phenol, 1,2,3-trihydroxy-4,6-bis(3,5-dimethyl-4-hydroxyphenyl methyl) benzene, 1,1,4,4-tetrakis(3-chloro-4-hydroxy-5-methylphenyl) cyclohexane, 1,1,4,4-tetrakis(4-hydroxy-5-methylphenyl) cyclohexane, 3,3,8,8-tetrakis(3-chlor-o-4-hydroxyphenyl)-bicyclo[4.4.0]decane, 2,2,7,7-tetrakis(4-hydroxyphenyl)-bicyclo[4.4.0]decane, 3,3,7,7-tetrakis(4-hydroxyphenyl)-bicyclo[3.3.0]octane, 3,3,7,7-tetrakis(4-hydroxy-3-methylphenyl)-bicyclo-[3.3.0]octane, 3,3,7,7-tetrakis(4-hydroxyphenyl)-bicyclo[4.3.0]nonane, 1,1,5,5-tetrakis(4-hydroxyphenyl) cyclooctane and the like.

Besides the above named compounds, other phenolic compounds such as 2,3,4,4'-tetrahydroxy benzophenone, 2,3,4,3',4',5'-hexahydroxy benzophenone, 2,4,4'-trihydroxy diphenyl sulfone, 2,4,2',4'-tetrahydroxy diphenyl sulfide and the like can be used as the reactant for the esterification reaction.

The naphthoquinone-1,2-diazide sulfonic acid which pertains to the esterification reaction of the above named phenolic compounds to form the esterification product as the component (c) is exemplified by naphthoquinone-1,2-diazide-4-sulfonic acid, naphthoquinone-1,2-diazide-5-sulfonic acid, naphthoquinone-1,2-diazide-6-sulfonic acid and the like, though not particularly limitative thereto. Naphthoquinone-1,2-diazide-5-sulfonic acid is particularly preferable in respect of the high post-exposure stability of the resist layer formed from the inventive photoresist composition. The post-exposure stability of the resist layer here implied means a property of the resist layer capable of giving a patterned resist layer having high fidelity to the photomask pattern even when the resist layer is kept standing for a length of time after the patternwise exposure of the resist layer to actinic rays before further processing of post-exposure baking and development.

The esterification product of the above described phenolic compound and a naphthoquinonediazide sulfonic acid compound as the component (c) can be prepared by the reaction of the phenolic compound and a reactive functional derivative of the naphthoquinonediazide sulfonic acid such as an acid chloride in an inert organic solvent such as dioxane, N-methylpyrrolidone, dimethyl acetamide, tetrahydrofuran and the like in the presence of a basic catalyst such as triethanolamine, pyridine, sodium carbonate, sodium hydrogencarbonate and the like followed by washing with water and drying of the reaction product.

The degree of esterification, i.e. the proportion of the hydroxy groups in the starting phenolic compound esterified by the esterification reaction, should be as high as possible and should be at least 60% or, preferably, at least 90% in respect of the efficiency for preventing the adverse influences by halation and standing waves.

Examples of particularly preferable esterification products as the component (c) in the inventive composition include those derived from the phenolic compound such as tris-(4-hydroxyphenyl) methane, bis(3,5-dimethyl-4-hydroxyphenyl) 2-hydroxyphenyl methane, bis(2,5-dimethyl-4-hydroxyphenyl) 2-hydroxyphenyl methane, bis (3,5-dimethyl-4-hydroxyphenyl) 3,4-dihydroxyphenyl methane, bis(2,5-dimethyl-4-hydroxyphenyl) 3,4-dihydroxyphenyl methane, bis(4-hydroxy-3-methylphenyl) 3,4-dihydroxyphenyl methane, bis(5-cyclohexyl-4-hydroxy-2-methylphenyl) 4-hydroxyphenyl methane, bis(5-cyclohexyl-4-hydroxy-2-methylphenyl) 3,4-dihydroxyphenyl methane, 1-[1-(4-hydroxyphenyl) isopropyl]-4-[1,1-bis(4-hydroxyphenyl)ethyl] benzene, 2,2-bis(2,3,4-trihydroxyphenyl) propane, bis(2,3,4-trihydroxyphenyl) methane and the like or, in particular, 1-[1-(4-hydroxyphenyl)isopropyl]-4-[1,1-bis(4-hydroxyphenyl)-ethyl] benzene, bis(3,5-dimethyl-4-hydroxyphenyl) 2-hydroxyphenyl methane, bis(3,5-dimethyl-4-hydroxyphenyl) 3,4-dihydroxyphenyl methane, bis(4-hydroxy-3-methylphenyl) 3,4-dihydroxyphenyl methane and bis(5-cyclohexyl-4-hydroxy-2-methylphenyl) 4-hydroxyphenyl methane, by the esterification reaction with naphthoquinone-1,2-diazide-5-sulfonic acid, of which the degree of esterification is almost 100%, in respect of the high sensitivity and high pattern resolution of the photoresist layer and the excellent orthogonality of the cross sectional profile of the patterned resist layer as well as the dimensional fidelity of patterning even after storage of the coating layer of the composition on the substrate surface before the development treatment to follow patternwise exposure to actinic rays.

The amount of the component (c) in the inventive photoresist composition is in the range from 0.5 to 20% by weight or, preferably, from 5 to 15% by weight based on the amount of the component (b). When the amount of the component (c) is too small, the desired halation-preventing effect cannot be fully exhibited as a matter of course while, when the amount thereof is too large, degradation is caused in the pattern resolution as well as in the cross sectional profile of the patterned resist layer.

In the following, the photoresist composition of the invention is described in more detail by way of examples as preceded by the description of the actual procedures for the preparation of the esterification products as the component (c). In the following examples, the photoresist compositions prepared there were subjected to the evaluation tests for the five testing items given below by the respective testing procedures described there.

(1) Photosensitivity:

A silicon wafer having a vapor-deposited plating layer of aluminum was coated with the photoresist composition in the form of a solution by using a spinner followed by drying for 90 seconds on a hot plate kept at 90° C. to give a uniform resist layer of the composition having a thickness of 0.7 µm. The thus formed resist layer was exposed patternwise to ultraviolet light on a minifying projection exposure machine (Model NSR-2005EX8A, manufactured by Nikon Co.) with an exposure dose varied stepwise with 1 mJ/cm² increments followed by a post-exposure baking treatment at 100° C. for 90 seconds and a development treatment in a 2.38% by weight aqueous solution of tetramethylammonium hydroxide at 23° C. for 60 seconds to give a patterned resist layer after washing with running water for 30 seconds and drying. Recording of the photosensitivity was made for the minimum exposure dose by which the residual film thickness in the areas exposed to light was substantially zero after development.

(2) Pattern resolution:

Recording was made for the critical line width resolved at an exposure dose by which resolution could be obtained for a line-and-space pattern of 0.25 µm line width.

(3) Halation preventing effect:

Recording was made in three ratings of A, B and C according to the following criteria.

A: good pattern reproduction with high fidelity to the mask pattern without local narrowing of patterned lines B: slight local narrowing detected in patterned lines C: noticeable local narrowing detected in patterned lines (4) Influences of standing waves:

Examination with a scanning electron microscope was made of the cross sectional profile of a patterned resist layer of 0.25 µm line width formed in the same manner as in (1) above to record the results in three ratings of A, B and C for good orthogonality, slight wavy deformation and noticeable wavy deformation, respectively.

(5) Stability of resist layer after patternwise exposure

The procedure down to the patternwise exposure of the resist layer on the substrate surface to actinic rays was substantially the same as in the item (1) above for the sensitivity but the patternwise exposed resist layer was kept for 20 minutes at room temperature before the post-exposure baking treatment. The thus obtained patterned resist layer was examined with a scanning electron microscope for the cross sectional profile to record the results in three ratings of A, B and C for an orthogonal cross section, slightly trapezoidal cross section and quasi-triangular cross section, respectively.

Preparation 1.

A first esterification product, referred to as the halation inhibitor A hereinafter, was prepared by the reaction of 1 mole of 1-[1-(4-hydroxyphenyl)isopropyl]-4-[1,1-bis(4-hydroxyphenyl)ethyl] benzene and 3 moles of naphthoquinone-1,2-diazide-5-sulfonyl chloride in dioxane as a solvent in the presence of triethanolamine.

Preparation 2.

A second esterification product, referred to as the halation inhibitor B hereinafter, was prepared by the reaction of 1 mole of 1-[1-(4-hydroxyphenyl)isopropyl]-4-[1,1-bis(4-hydroxyphenyl)ethyl] benzene and 3 moles of naphthoquinone-1,2-diazide-4-sulfonyl chloride in the same manner as in Preparation 1.

Preparation 3.

A third esterification product, referred to as the halation inhibitor C hereinafter, was prepared by the reaction of 1 mole of bis(4-hydroxy-3,5-dimethylphenyl)-2-hydroxyphenyl methane and 2 moles of naphthoquinone-1,2-diazide-5-sulfonyl chloride in the same manner as in Preparation 1.

Preparation 4.

A fourth esterification product, referred to as the halation inhibitor D hereinafter, was prepared by the reaction of 1 mole of bis(4-hydroxy-3,5-dimethylphenyl)-2-hydroxyphenyl methane and 2 moles of naphthoquinone-1,2-diazide-4-sulfonyl chloride in the same manner as in Preparation 1.

Preparation 5.

A fifth esterification product, referred to as the halation inhibitor E hereinafter, was prepared by the reaction of 1 mole of bis(3-cyclohexyl-4-hydroxy-6-methylphenyl)-4-hydroxyphenyl methane and 3 moles of naphthoquinone-1,2-diazide-5-sulfonyl chloride in the same manner as in Preparation 1.

Preparation 6.

A sixth esterification product, referred to as the halation inhibitor F hereinafter, was prepared by the reaction of 1 mole of bis(4-hydroxy-3,5-dimethylphenyl)-3,4-dihydroxyphenyl methane and 3 moles of naphthoquinone-1,2-diazide-4-sulfonyl chloride in the same manner as in Preparation 1.

EXAMPLES 1 TO 6

A positive-working photoresist composition was prepared in each of Examples 1 to 6 by dissolving, in 500 parts by weight of propyleneglycol monomethyl ether acetate, 30 parts by weight of a first poly(hydroxystyrene)-based resin having a weight-average molecular weight of 10000 and having tert-butyloxycarbonyloxy groups substituting for 36% of the hydroxy groups in a poly(hydroxystyrene) resin, 70 parts by weight of a second poly(hydroxystyrene)-based resin having a weight-average molecular weight of 10000 and having ethoxyethoxy groups substituting for 36% of the hydroxy groups in a poly(hydroxystyrene) resin, 7 parts by weight of bis(cyclohexylsulfonyl) diazomethane and 10 parts by weight of one of the above prepared halation inhibitors A to F, respectively, followed by filtration of the solution through a membrane filter having a pore diameter of 0.2 µm.

The results obtained in the evaluation tests of these photoresist compositions are shown in Table 1 below.

COMPARATIVE EXAMPLE 1

The formulation and testing procedures of the photoresist composition were substantially the same as in Example 1 described above excepting omission of the halation inhibitor in the formulation of the composition.

The results obtained in the evaluation tests of this photoresist composition are shown in Table 1 below.

COMPARATIVE EXAMPLE 2

The formulation and testing procedures of the photoresist composition were substantially the same as in Example 1 described above excepting omission of the bis(cyclohexylsulfonyl) diazomethane in the formulation of the composition.

The results obtained in the evaluation tests of this photoresist composition are shown in Table 1 below.

COMPARATIVE EXAMPLE 3

The formulation and testing procedures of the photoresist composition were substantially the same as in Example 2 described above excepting omission of the bis (cyclohexylsulfonyl) diazomethane in the formulation of the composition.

The results obtained in the evaluation tests of this photoresist composition are shown in Table 1 below.

TABLE 1

| | Photo-sensitivity, mJ/cm$^2$ | Pattern resolution, μm | Halation preventing effect | Influences of standing waves | Post-exposure stability |
|---|---|---|---|---|---|
| Example 1 | 43 | 0.21 | A | A | A |
| Example 2 | 40 | 0.21 | A | A | B |
| Example 3 | 40 | 0.21 | A | A | B |
| Example 4 | 38 | 0.21 | A | A | B |
| Example 5 | 42 | 0.21 | A | A | A |
| Example 6 | 40 | 0.21 | A | A | B |
| Comparative Example 1 | 37 | 0.20 | C | B | B |
| Comparative Example 2 | 300 | 1) | 2) | 2) | 2) |
| Comparative Example 3 | 250 | 0.30 | A | A | 2) |

Note:
1) no resolution
2) no pattern formed

What is claimed is:

1. A chemical sensitization-type positive-working photoresist composition which consists essentially of as a uniform blend:

(a) from 1 to 20 parts by weight of a compound capable of generating an acid by the irradiation with actinic rays selected from the group consisting of bis(sulfonyl) diazomethane compounds, sulfonylcarbonyl alkane compounds, sulfonylcarbonyl diazomethane compounds, nitrobenzyl sulfonate compounds, ester compounds of a polyhydroxy compound and an aliphatic sulfonic acid or an aromatic sulfonic acid, of which the aromatic group is phenyl or benzyl group, and onium salt compounds;

(b) 100 parts by weight of a polymeric resin which is imparted with increased solubility in an aqueous alkaline solution in the presence of an acid which is a combination of a first poly(hydroxystyrene)-based polymeric resin having tert-butoxycarbonyl groups substituting for 10 to 60% of the hydrogen atoms of the hydroxy groups in a poly(hydroxystyrene) resin and a second poly(hydroxystyrene)-based polymeric resin having alkoxyalkyl groups, of which the alkoxy group and the alkyl group each have 1 to 4 carbon atoms, substituting for 10 to 60% of the hydrogen atoms of the hydroxy groups in a poly(hydroxystyrene) resin in a weight proportion in the range from 10:90 to 70:30; and (c) from 0.5 to 20 parts by weight of an esterification product between a phenolic compound having a molecular weight not exceeding 1000 and a naphthoquinone-1,2-diazide sulfonic acid, which serves as a halation inhibitor.

2. The chemical sensitization-type positive-working photoresist composition as claimed in claim 1 in which the phenolic compound, from which the component (c) is prepared by the esterification reaction with a naphthoquinone-1,2-diazide sulfonic acid, is a compound represented by the formula

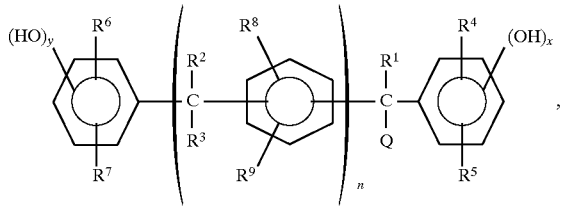

in which $R^1$, $R^2$ and $R^3$ are each a hydrogen atom or an alkyl group having 1 to 4 carbon atoms, $R^4$ to $R^7$ are each a group or atom selected from the group consisting of a hydrogen atom, halogen atoms, alkyl groups having 1 to 4 carbon atoms, alkoxy groups having 1 to 4 carbon atoms, alkenyl groups having 2 to 4 carbon atoms and cyclohexyl group, $R^8$ and $R^9$ are each a hydrogen atom, halogen atom or alkyl group having 1 to 4 carbon atoms, Q is a hydrogen atom, alkyl group having 1 to 4 carbon atoms or a phenolic group represented by the formula

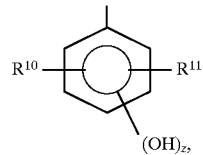

$R^{10}$ and $R^{11}$ each being a group or atom selected from the group consisting of a hydrogen atom, halogen atoms, alkyl groups having 1 to 4 carbon atoms, alkoxy groups having 1 to 4 carbon atoms, alkenyl groups having 2 to 4 carbon atoms and cyclohexyl group and the subscript z being 1, 2 or 3, the subscripts x and y are each 1, 2 or 3 and the subscript n is 0 or 1.

3. The chemical sensitization-type positive-working photoresist composition as claimed in claim 1 in which the phenolic compound, from which the component (c) is prepared by the esterification reaction with a naphthoquinone-1,2-diazide sulfonic acid, is a compound represented by the formula

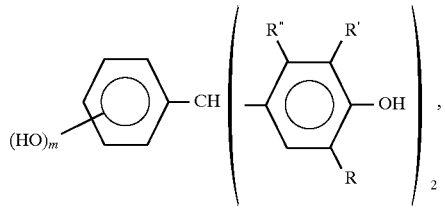

in which R is a methyl or cyclohexyl group, R' and R" are each a hydrogen atom or methyl group and the subscript m is 1 or 2.

4. The chemical sensitization-type positive-working photoresist composition as claimed in claim 1 in which the phenolic compound, from which the component (c) is prepared by the esterification reaction with a naphthoquinone-1,2-diazide sulfonic acid, is 1-[1-(4-hydroxyphenyl) isopropyl]-4-[1,1-bis(4-hydroxyphenyl)ethyl] benzene.

5. The chemical sensitization-type positive-working photoresist composition as claimed in claim 1 in which the naphthoquinone-1,2-diazide sulfonic acid, from which the component (c) is prepared by the esterification reaction with a phenolic compound, is naphthoquinone-1,2-diazide-5-sulfonic acid or naphthoquinone-1,2-diazide-4-sulfonic acid.

6. The chemical sensitization-type positive-working photoresist composition as claimed in claim 1 in which the component (a) is a bis(sulfonyl) diazomethane compound.

7. The chemical sensitization-type positive-working photoresist composition as claimed in claim 6 in which the bis(sulfonyl) diazomethane compound is bis(cyclohexylsulfonyl) diazomethane or bis(2,4-dimethylphenylsulfonyl) diazomethane.

8. The chemical sensitization-type positive-working photoresist composition as claimed in claim 1 in which the alkoxyalkyl group in the second poly(hydroxystyrene)-based polymeric resin is 1-ethoxyethyl group or 1-methoxy-n-propyl group.

9. The chemical sensitization-type positive-working photoresist composition as claimed in claim 1 in which the component (b) has a weight-average molecular weight in the range from 3000 to 30000.

10. The chemical sensitization-type positive-working photoresist composition as claimed in claim 1 in which the degree of esterification of the phenolic hydroxy groups in the phenolic compound with the naphthoquinone-1,2-diazide sulfonic acid is at least 60%.

11. The chemical sensitization-type positive-working photoresist composition as claimed in claim 10 in which the degree of esterification of the phenolic hydroxy groups in the phenolic compound with the naphthoquinone-1,2-diazide sulfonic acid is at least 90%.

12. The chemical sensitization-type positive-working photoresist composition as claimed in claim 1 in which the amount of the component (c) is in the range from 5 to 15 parts by weight per 100 parts by weight of the component (b).

13. A chemical sensitization-type positive-working photoresist composition which consists essentially of, as a uniform blend:
 (a) from 1 to 20 parts by weight of a compound capable of generating an acid by the irradiation with actinic rays;
 (b) 100 parts by weight of a polymeric resin which is imparted with increased solubility in an aqueous alkaline solution in the presence of an acid; and
 (c) from 0.5 to 20 parts by weight of an esterification product between a phenolic compound having a molecular weight not exceeding 1000 and a naphthoquinone-1,2-diazide sulfonic acid, which serves as a halation inhibitor, wherein the phenolic compound is represented by the formula

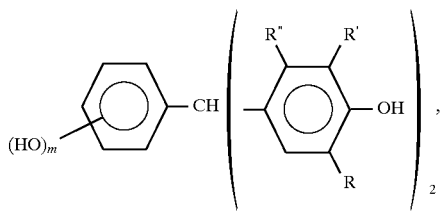

in which R is a methyl or cyclohexyl group, R' and R" are each a hydrogen atom or methyl group and the subscript m is 1 or 2.

14. The chemical sensitization-type positive-working photoresist composition as claimed in claim 13 in which the naphthoquinone-1,2-diazide sulfonic acid, from which the component (c) is prepared by the esterification reaction with a phenolic compound, is naphthoquinone-1,2-diazide-5-sulfonic acid or naphthoquinone-1,2-diazide-4-sulfonic acid.

15. The chemical sensitization-type positive-working photoresist composition as claimed in claim 13 in which the component (a) is selected from the group consisting of bis(sulfonyl) diazomethane compounds, sulfonylcarbonyl alkane compounds, sulfonylcarbonyl diazomethane compounds, nitrobenzyl sulfonate compounds, ester compounds of a polyhydroxy compound and an aliphatic sulfonic acid or an aromatic sulfonic acid, of which the aromatic group is phenyl or benzyl group, and onium salt compounds.

16. The chemical sensitization-type positive-working photoresist composition as claimed in claim 15 in which the component (a) is a bis(sulfonyl) diazomethane compound.

17. The chemical sensitization-type positive-working photoresist composition as claimed in claim 16 in which the bis(sulfonyl) diazomethane compound is bis(cyclohexylsulfonyl) diazomethane or bis(2,4-dimethylphenylsulfonyl) diazomethane.

18. The chemical sensitization-type positive-working photoresist composition as claimed in claim 13 in which the component (b) is a poly(hydroxystyrene)-based polymeric resin having protective groups selected from the group consisting of tert-butoxycarbonyl group, tert-butyl group, tert-amyloxycarbonyl group, alkoxyalkyl groups, tetrahydropyranyl group and tetrahydrofuranyl group substituting for at least a part of the hydrogen atoms of the hydroxy groups in a poly(hydroxystyrene) resin.

19. The chemical sensitization-type positive-working photoresist composition as claimed in claim 18 in which the component (b) is a combination of a first poly(hydroxystyrene)-based polymeric resin having tert-butoxycarbonyl groups substituting for 10 to 60% of the hydrogen atoms of the hydroxy groups in a poly(hydroxystyrene) resin and a second poly(hydroxystyrene)-based polymeric resin having alkoxyalkyl groups, of which the alkoxy group and the alkyl group each have 1 to 4 carbon atoms, substituting for 10 to 60% of the hydrogen atoms of the hydroxy groups in a poly(hydroxystyrene) resin in a weight proportion in the range from 10:90 to 70:30.

20. The chemical sensitization-type positive-working photoresist composition as claimed in claim 19 in which the alkoxyalkyl group in the second poly(hydroxystyrene)-based polymeric resin is 1-ethoxyethyl group or 1-methoxy-n-propyl group.

21. The chemical sensitization-type positive-working photoresist composition as claimed in claim 13 in which the component (b) has a weight-average molecular weight in the range from 3000 to 30000.

22. The chemical sensitization-type positive-working photoresist composition as claimed in claim 13 in which the degree of esterification of the phenolic hydroxy groups in the phenolic compound with the naphthoquinone-1,2-diazide sulfonic acid is at least 60%.

23. The chemical sensitization-type positive-working photoresist composition as claimed in claim 22 in which the degree of esterification of the phenolic hydroxy groups in the phenolic compound with the naphthoquinone-1,2-diazide sulfonic acid is at least 90%.

24. The chemical sensitization-type positive-working photoresist composition as claimed in claim 13 in which the amount of component (c) is in the range from 5 to 15 parts by weight per 100 parts by weight of component (b).

25. A chemical sensitization-type positive-working photoresist composition which consists essentially of, as a uniform blend:
 (a) from 1 to 20 parts by weight of a compound capable of generating an acid by the irradiation with actinic rays;
 (b) 100 parts by weight of a polymeric resin which is imparted with increased solubility in an aqueous alkaline solution in the presence of an acid; and (c) from 0.5 to 20 parts by weight of an esterification product between a phenolic compound having a molecular weight not exceeding 1000 and a naphthoquinone-1,2-diazide sulfonic acid, which serves as a halation inhibitor, wherein the phenolic compound is represented by the formula

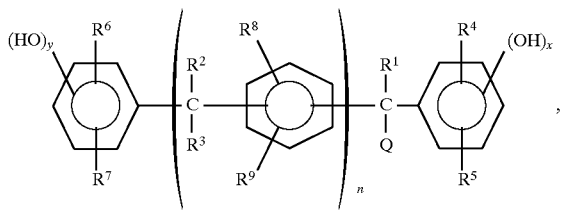

in which $R^1$, $R^2$ and $R^3$ are each a hydrogen atom or an alkyl group having 1 to 4 carbon atoms, $R^4$ to $R^7$ are each a group or atom selected from the group consisting of a hydrogen atom, halogen atoms, alkyl groups having 1 to 4 carbon atoms, alkoxy groups having 1 to 4 carbon atoms, alkenyl groups having 2 to 4 carbon atoms and cyclohexyl group, $R^8$ and $R^9$ are each a hydrogen atom, halogen atom or alkyl group having 1 to 4 carbon atoms, Q is a hydrogen atom, alkyl group having 1 to 4 carbon atoms or a phenolic group represented by the formula

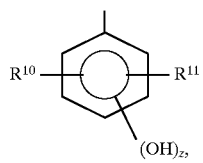

$R^{10}$ and $R^{11}$ each being a group or atom selected from the group consisting of a hydrogen atom, halogen atoms, alkyl groups having 1 to 4 carbon atoms, alkoxy groups having 1 to 4 carbon atoms, alkenyl groups having 2 to 4 carbon atoms and cyclohexyl group and the subscript z being 1, 2 or 3, the subscripts x and y are each 1, 2 or 3 and the subscript n is 0 or 1.

26. The chemical sensitization-type positive-working photoresist composition as claimed in claim 25 in which the naphthoquinone-1,2-diazide sulfonic acid, from which the component (c) is prepared by the esterification reaction with a phenolic compound, is naphthoquinone-1,2-diazide-5-sulfonic acid or naphthoquinone-1,2-diazide-4-sulfonic acid.

27. The chemical sensitization-type positive-working photoresist composition as claimed in claim 26 in which the component (a) is selected from the group consisting of bis(sulfonyl) diazomethane compounds, sulfonylcarbonyl alkane compounds, sulfonylcarbonyl diazomethane compounds, nitrobenzyl sulfonate compounds, ester compounds of a polyhydroxy compound and an aliphatic sulfonic acid or an aromatic sulfonic acid, of which the aromatic group is phenyl or benzyl group, and onium salt compounds.

28. The chemical sensitization-type positive-working photoresist composition as claimed in claim 27 in which the component (a) is a bis(sulfonyl) diazomethane compound.

29. The chemical sensitization-type positive-working photoresist composition as claimed in claim 28 in which the bis(sulfonyl) diazomethane compound is bis(cyclohexylsulfonyl) diazomethane or bis(2,4-dimethylphenylsulfonyl) diazomethane.

30. The chemical sensitization-type positive-working photoresist composition as claimed in claim 25 in which the component (b) is a poly(hydroxystyrene)-based polymeric resin having protective groups selected from the group consisting of tert-butoxycarbonyl group, tert-butyl group, tert-amyloxycarbonyl group, alkoxyalkyl groups, tetrahydropyranyl group and tetrahydrofuranyl group substituting for at least a part of the hydrogen atoms of the hydroxy groups in a poly(hydroxystyrene) resin.

31. The chemical sensitization-type positive-working photoresist composition as claimed in claim 30 in which the component (b) is a combination of a first poly(hydroxystyrene)-based polymeric resin having tert-butoxycarbonyl groups substituting for 10 to 60% of the hydrogen atoms of the hydroxy groups in a poly(hydroxystyrene) resin and a second poly(hydroxystyrene)-based polymeric resin having alkoxyalkyl groups, of which the alkoxy group and the alkyl group each have 1 to 4 carbon atoms, substituting for 10 to 60% of the hydrogen atoms of the hydroxy groups in a poly(hydroxystyrene) resin in a weight proportion in the range from 10:90 to 70:30.

32. The chemical sensitization-type positive-working photoresist composition as claimed in claim 31 in which the alkoxyalkyl group in the second poly(hydroxystyrene)-based polymeric resin is 1-ethoxyethyl group or 1-methoxy-n-propyl group.

33. The chemical sensitization-type positive-working photoresist composition as claimed in claim 25 in which the component (b) has a weight-average molecular weight in the range from 3000 to 30000.

34. The chemical sensitization-type positive-working photoresist composition as claimed in claim 25 in which the degree of esterification of the phenolic hydroxy groups in the phenolic compound with the naphthoquinone-1,2-diazide sulfonic acid is at least 60%.

35. The chemical sensitization-type positive-working photoresist composition as claimed in claim 34 in which the degree of esterification of the phenolic hydroxy groups in the phenolic compound with the naphthoquinone-1,2-diazide sulfonic acid is at least 90%.

36. The chemical sensitization-type positive-working photoresist composition as claimed in claim 25 in which the amount of component (c) is in the range from 5 to 15 parts by weight per 100 parts by weight of component (b).

37. A chemical sensitization-type positive-working photoresist composition which consists essentially of, a uniform blend:
(a) from 1 to 20 parts by weight of a compound capable of generating an acid by the irradiation with actinic rays;
(b) 100 parts by weight of a polymeric resin which is imparted with increased solubility in an aqueous alkaline solution in the presence of an acid; and
(c) from 0.5 to 20 parts by weight of an esterification product between a phenolic compound having a molecular weight not exceeding 1000 and a naphthoquinone-1,2-diazide sulfonic acid, which serves as a halation inhibitor, wherein the phenolic compound is 1-[1-(4-hydroxyphenyl) isopropyl]-4-[1, 1-bis(4-hydroxyphenyl)ethyl] benzene.

38. The chemical sensitization-type positive-working photoresist composition as claimed in claim 37 in which the naphthoquinone-1,2-diazide sulfonic acid, from which the component (c) is prepared by the esterification reaction with a phenolic compound, is naphthoquinone-1,2-diazide-5-sulfonic acid or naphthoquinone-1,2-diazide-4-sulfonic acid.

39. The chemical sensitization-type positive-working photoresist composition as claimed in claim 37 in which the component (a) is selected from the group consisting of bis(sulfonyl) diazomethane compounds, sulfonylcarbonyl alkane compounds, sulfonylcarbonyl diazomethane compounds, nitrobenzyl sulfonate compounds, ester compounds of a polyhydroxy compound and an aliphatic sulfonic acid or an aromatic sulfonic acid, of which the aromatic group is phenyl or benzyl group, and onium salt compounds.

40. The chemical sensitization-type positive-working photoresist composition as claimed in claim 39 in which the component (a) is a bis(sulfonyl) diazomethane compound.

41. The chemical sensitization-type positive-working photoresist composition as claimed in claim 40 in which the bis(sulfonyl) diazomethane compound is bis (cyclohexylsulfonyl) diazomethane or bis(2,4-dimethylphenylsulfonyl) diazomethane.

42. The chemical sensitization-type positive-working photoresist composition as claimed in claim 37 in which the component (b) is a poly(hydroxystyrene)-based polymeric resin having protective groups selected from the group consisting of tert-butoxycarbonyl group, tert-butyl group, tert-amyloxycarbonyl group, alkoxyalkyl groups, tetrahydropyranyl group and tetrahydrofuranyl group substituting for at least a part of the hydrogen atoms of the hydroxy groups in a poly(hydroxystyrene) resin.

43. The chemical sensitization-type positive-working photoresist composition as claimed in claim 42 in which the component (b) is a combination of a first poly (hydroxystyrene)-based polymeric resin having tert-butoxycarbonyl groups substituting for 10 to 60% of the hydrogen atoms of the hydroxy groups in a poly (hydroxystyrene) resin and a second poly(hydroxystyrene)-based polymeric resin having alkoxyalkyl groups, of which the alkoxy group and the alkyl group each have 1 to 4 carbon atoms, substituting for 10 to 60% of the hydrogen atoms of the hydroxy groups in a poly(hydroxystyrene) resin in a weight proportion in the range from 10:90 to 70:30.

44. The chemical sensitization-type positive-working photoresist composition as claimed in claim 43 in which the alkoxyalkyl group in the second poly(hydroxystyrene)-based polymeric resin is 1-ethoxyethyl group or 1-methoxy-n-propyl group.

45. The chemical sensitization-type positive-working photoresist composition as claimed in claim 37 in which the component (b) has a weight-average molecular weight in the range from 3000 to 30000.

46. The chemical sensitization-type positive-working photoresist composition as claimed in claim 37 in which the degree of esterification of the phenolic hydroxy groups in the phenolic compound with the naphthoquinone-1,2-diazide sulfonic acid is at least 60%.

47. The chemical sensitization-type positive-working photoresist composition as claimed in claim 46 in which the degree of esterification of the phenolic hydroxy groups in the phenolic compound with the naphthoquinone-1,2-diazide sulfonic acid is at least 90%.

48. The chemical sensitization-type positive-working photoresist composition as claimed in claim 37 in which the amount of component (c) is in the range from 5 to 15 parts by weight per 100 parts by weight of component (b).

* * * * *